United States Patent [19]
Sedlak et al.

[11] Patent Number: 5,991,207
[45] Date of Patent: Nov. 23, 1999

[54] CIRCUIT CONFIGURATION HAVING A NUMBER OF ELECTRONIC CIRCUIT COMPONENTS

[75] Inventors: Holger Sedlak, München; Stefan Pfab, Pullach; Klaus Oberländer, Augsburg, all of Germany

[73] Assignee: Siemens Aktiengesellschaft, Munich, Germany

[21] Appl. No.: 09/163,627

[22] Filed: Sep. 28, 1998

Related U.S. Application Data

[63] Continuation of application No. PCT/DE97/00622, Mar. 26, 1997.

[30] Foreign Application Priority Data

Mar. 28, 1996 [DE] Germany .......................... 196 12 440

[51] Int. Cl.⁶ .................................................... G11C 7/00
[52] U.S. Cl. ............................... 365/189.01; 365/189.12; 365/195
[58] Field of Search .............................. 365/195, 189.01, 365/189.12, 218, 233

[56] References Cited

U.S. PATENT DOCUMENTS

| | | | |
|---|---|---|---|
| 4,572,946 | 2/1986 | Schrenk | 235/380 |
| 4,928,266 | 5/1990 | Abbott et al. | 365/189.01 |
| 5,155,856 | 10/1992 | Bock et al. | 395/800 |
| 5,381,366 | 1/1995 | Kawauchi et al. | 365/185.04 |
| 5,724,289 | 3/1998 | Watanabe | 365/195 |

FOREIGN PATENT DOCUMENTS

| | | |
|---|---|---|
| 0 574 094 A2 | 12/1993 | European Pat. Off. |
| 41 35 767 A1 | 5/1993 | Germany. |

OTHER PUBLICATIONS

International Publication No. WO 82/02274 (Edström), dated Jul. 8, 1982.

*Primary Examiner*—Son T. Dinh
*Attorney, Agent, or Firm*—Herbert L. Lerner; Laurence A. Greenberg

[57] ABSTRACT

A circuit configuration having a number of electronic circuit components. The operating state of the circuit components can be set to a reset or erase state by a predetermined control signal applied to the respective circuit component in which state a data content of the circuit component assumes a logic zero value. For the purpose of chronologically successive resetting the data contents of all the circuit components, a selection circuit is provided which is activated to allow the writing of the logic zero value to the circuit components. The selection circuit has a number of opening stages corresponding to the number of circuit components. The opening stages are connected in series one after the other and each circuit component is respectively assigned an opening stage of the selection circuit. Each opening stage with the exception of the first opening stage is activated or driven by an opening signal which is generated by the immediately preceding opening stage, for the purpose of outputting a control signal to the associated circuit component. Following the resetting of the associated circuit component, the opening stage in turn outputs an opening signal for the purpose of driving or activating an immediately succeeding opening stage.

3 Claims, 2 Drawing Sheets

CIRCUIT CONFIGURATION HAVING A NUMBER OF ELECTRONIC CIRCUIT COMPONENTS

CROSS-REFERENCE TO RELATED APPLICATION

This application is a continuation of copending International Application No. PCT/DE97/00622, filed on Mar. 26, 1997, which designated the United States.

BACKGROUND OF THE INVENTION

1. Field of the Invention

The invention relates to a circuit configuration having a number of electronic circuit components. The operating state of the circuit components can be set to a reset or erase state by a predetermined control signal which is applied to the respective circuit component, in which state the data content of the circuit component assumes a logic zero value.

For various reasons, it may be necessary to erase individual registers or the complete content of a semiconductor memory integrated on a microprocessor chip or of a further circuit component. Particularly in smart card applications, it may be desirable, as protection against the unauthorized read-out of confidential data, to provide actively operating protective measures for preventing a read-out of secret data in the event of a hacker attack, for example, even when the clock supply of the microprocessor is disconnected. When the microprocessor is switched on, all of the registers are, as a rule, preassigned a defined value that is exchanged for different data contents in the course of data processing, which data contents may, under certain circumstances, also include confidential or personal values. In order to preassign a predetermined, defined value to the registers, the latter are usually provided with a separately provided reset input. The reset input passes, for example, to a switching transistor that brings the register value to a defined potential. In the case of a random access semiconductor memory having a multiplicity of memory cells, the provision of separate reset inputs for each memory cell would greatly increase the area requirement. In addition, this procedure requires a large driver power for resetting the memory since, for example, 256×8 transistors must be driven simultaneously. Such a configuration would contradict not only the desire for a maximum integration level of a semiconductor memory but also a construction of the selection circuits which saves current and is as simple as possible. An active protective measure against unauthorized access to confidential data that might furthermore be conceived of is, by use of the microprocessor, to address successively all the relevant memory cells of the semiconductor device and subsequently to overwrite every addressed memory cell with the logic zero value. However, such a solution is not successful in preventing unauthorized data access in all cases, since it is possible to inhibit the clock supply, the microprocessor stops and cannot perform any tasks.

From U.S. Pat. No. 4,928,266, there is known a selection circuit with a chain of n-delay elements, whose first RESET is selected by an internal reset signal, and a multiplicity of n-reset-drivers, each of which is selected by a delay element. The purpose of the phase-shifted selection is to reduce the current peaks caused by the reset signals.

A chain of "flash-clear" circuits which are addressed chronologically delayed successively, whereby the circuit is activated by a start signal by a starting circuit is disclosed in European Patent Application EP 0 574 094 A, corresponding to U.S. Pat. Nos. 5,054,000 and 5,047,985. The reference further shows, with respect to the circuit, a simplified version of the "flash-clear" circuit with a ring oscillator. The ring oscillator has an oscillating holding function for generating clock pulses which are used for setting the erase time with a counter for counting the number of output clock pulses of the ring oscillator, and a m-bit counter for counting the number of memory cell groups.

International Patent Application WO 82 022 74 A discloses a configuration for the automatic erasing of the data contents in data banks of a particular circuit. An "emergency circuit", which after actuation in a first step controls the erasing of all data information in the data bank and then, in a second step, the erasing of all program information in the data bank. This particular circuit configuration serves primarily for erasing a data bank before unauthorized access or sabotage occurs without physically destroying it. The circuit configuration has a bistable flip-flop operable by an emergency button, whose output signal activates the address generators controlled by the system clock, that is to say, all addresses are generated, which can occur in the connected data memories. The address generators operate in parallel to one another.

A configuration for protecting data against unauthorized access in a control unit of a coin-operated automated machine is disclosed in Published, Non-prosecuted German Patent Application DE 41 35 767 A. Sensors detect any attempt at opening the housing that protects the control unit. The sensors which detect a mechanical or chemical access, a change in ambient temperature, as well as an operating voltage, are connected to a sensor technique with its own power supply. The data in the data-relevant components are erased by an erasing circuit when accessing the control unit.

SUMMARY OF THE INVENTION

It is accordingly an object of the invention to provide a circuit configuration having a number of electronic circuit components which overcomes the above-mentioned disadvantages of the prior art devices of this general type, in which automatic resetting of the data contents of selected circuit components to a logic zero value can be activated even independently of an external clock supply, without significantly increasing the area requirement or the circuitry outlay of the circuit configuration.

With the foregoing and other objects in view there is provided, in accordance with the invention, a circuit configuration, including: a plurality of circuit components including registers, circuit elements and memory elements all having data contents; a first selection circuit having a number of opening stages including a first opening stage receiving a trigger signal and a last opening stage, the first selection circuit connected to the registers and the circuit elements; a second selection circuit having a number of opening stages including an initial opening stage connected to the last opening stage of the first selection circuit, the second selection circuit is connected to the memory elements; the first selection circuit and the second selection circuit operating automatically after receiving the trigger signal and operating independently of an external clock supply for chronologically and successively selecting all of the plurality of circuit components for setting the data contents of the circuit components to a logic zero value, the opening stages of the first and second selection circuits are connected in series one after another and corresponding to a number of the plurality of circuit components, after receiving the trigger signal the first opening stage outputting a predetermined output signal received by a respective one of the plurality of circuit components, the first opening stage also outputting an opening signal for driving an immediately succeeding opening stage, each of the output stages following the first output stage successively receiving a respective opening signal from a previous output stage and generating a respective output signal received by a respective one of the plurality of circuit components and outputting a respective opening signal to be received by a respective succeeding opening stage; and a data bus having a logic value including a logic zero value connected to the memory elements, the data bus receiving a write signal for writing the logic zero value present on the date bus into the memory elements to bring the memory elements into an erased state after the second selection circuit is actuated.

In accordance with an added feature of the invention, each of the plurality of circuit components is connected to a respective opening stage of the first selection circuit and the second selection circuit.

The invention is in this case based on the insight of providing an automatically activatable selection circuit, which operates analogously to the known mechanical domino chain, for the purpose of erasing the data contents of individual circuit components such as, for example, registers or memory cells of semiconductor memories. Once triggered, the selection circuit according to the invention operates separately and completely independently of the external clock supply of a control circuit such as, for example, of a microcontroller which can be stopped in the event of unauthorized access, with the result that it is possible, at leisure so to speak, to read out confidential data contents particularly from the static semiconductor memory, which is especially at risk. After the detection of a suitable trigger signal, which is effected, for example, after the detection of an impermissible deviation from the permitted operating state of the control circuit or of a circuit component, an enable signal is set, which triggers, as it were, the electronic domino chain via the selection circuit. As a reaction to the triggering of the enable signal, a first circuit component from a multiplicity of selected circuit components of the circuit configuration which are to be correspondingly erased, for example an accumulator or a register of the microcontrollor, is actuated, in the sense of being reset or erased, by a first opening stage, which is actuated by an opening signal, and chronologically successively, after the first opening stage has been actuated, a further, second opening signal is generated which triggers a further opening stage, for example for the purpose of activating an address decoder and subsequently erasing a group of addressed memory cells of a static semiconductor memory. The operation is followed by further opening signals corresponding to the desired number of circuit components to be selected.

In a preferred embodiment of the invention, it may be provided that each circuit component is respectively assigned a single opening stage of the selection circuit.

In a preferred embodiment of the circuit configuration according to the invention, an address bus for addressing a circuit component is provided and a data bus is provided on which a data signal for writing a data content to a circuit component is made available. After the opening of a circuit component by the assigned opening stage of the selection circuit, a logic zero value present on the data bus, for example, is written to the circuit component, with the result that the circuit component is in this way transferred to the erased state. In a particularly preferred embodiment, logic zero values are present, for example, on all the lines of the data bus. By use of the selection circuit, the individual circuit components which are connected to the data bus are chronologically successively opened and, as a reaction to the opening, the logic zero values on the data bus are chronologically successively written to the individual circuit components. Compared with the measure disclosed in the prior art, in which each circuit component or each memory cell requires an area-consuming reset transistor in order to present a sufficiently large reset signal, the circuit configuration according to the invention has the advantage of a far lower area requirement. Compared with a further measure used hitherto in the prior art, in which the address decoder is provided with an additional circuit which enables simultaneous opening of all the memory cells, and in which, consequently, a sufficiently large driver power of the data bus is necessary in order to draw all the memory cells simultaneously to the logic value zero, the circuit configuration according to the invention has the advantage that the data bus must provide a significantly smaller driver power, since the circuit components or memory cells are addressed successively rather than simultaneously.

In a further preferred embodiment of the invention, which has a particular simple circuitry realization of the selection circuit, there is provided that the opening signal output by the last opening stage of the selection circuit is fed back in a feedback loop to the input of the first opening stage of the second selection circuit.

In a particularly preferred embodiment of the invention, it is provided that the circuit components constitute memory cells of a register and/or of programmable semiconductor memory. In this case, it is advantageously provided that the opening stages assigned to the memory cells of the register are connected upstream of the opening stages which are assigned to the memory cells of the programmable semiconductor memory. Consequently, following the triggering of the selection circuit by the enable signal, all of the registers and then the memory cells of the semiconductor memory are opened. The registers in this case support the driver power of the data bus. Such an order of the opening stages is also advantageous because when memory cells of a dynamic random access semiconductor memory (RAM) are selected, it is possible only by additional circuitry to identify when the individual opening stages of the selection circuit are completely run through. Owing to the dependents of the addressing of the memory cell or of the group of memory cells on the previous address in each case, it is not possible to make an unambiguous assignment as to what the "first" or "last" group to be selected actually is.

A further advantage of the circuit configuration according to the invention by analogy with the mechanical domino chain consists in the fact that only a respective inverter of an opening stage is required for the chronologically successive driving of the individual opening stages, and, furthermore, each preceding opening stage actuates or drives the respective succeeding opening stage.

In a particularly preferred embodiment of the invention, it is provided that the selection circuit is automatically triggered by the input of the enable signal at the first opening stage. In this case, it is advantageously possible to provide a sensor circuit which is connected upstream of the selection circuit and assigned to the control circuit provided in the circuit configuration and serving for the electronic control of one or more circuit components. The sensor circuit detects a deviation from the permitted operating state of the control circuit or of a circuit component and, as a reaction to a deviation of the permitted operating state, outputs the enable signal to the first opening stage for the purpose of automatic activation of the selection circuit. In a realization which is simple in terms of circuitry, it may be provided in this case that the sensor circuit is assigned to the clock supply and/or the voltage supply of the control circuit or a circuit component and detects a deviation of the supply voltage from the operating voltage and/or a deviation of the supply clock signal from the operating clock signal and generates the enable signal given the presence of a deviation of the operating voltage and/or of the operating clock signal and outputs the said enable signal to the first opening stage for the purpose of automatic triggering or activation of the selection circuit. In this case, the sensor circuit may have a voltage detector circuit that detects when the predetermined upper and lower limit values of the operating voltage are upwardly transgressed and downwardly transgressed, respectively, by the supply voltage. On the other hand, the sensor circuit may also have a frequency detector circuit that detects when the upper and lower limit values of the operating clock signal are upwardly transgressed and downwardly transgressed, respectively, by the supply clock signal. In this way, unauthorized access to confidential data can be identified, for example, given the presence of an excessively high or excessively low operating voltage, or given the presence of an excessively low or excessively high clock rate and be used for automatically triggering the selection circuit.

In order to ensure that the necessary driver power of the data bus suffices under all circumstances for successively toggling the data contents of the circuit components to be selected, it is possible to use a regulator to stop the progress of the opening of the circuit components to be addressed when the driver power of the data bus is too low. In a preferred embodiment of the invention, therefore, a regulating circuit is advantageously provided which is assigned to the selection circuit and, in the event of a malfunction of the data bus or of the data driver, controls renewed activation of the selection circuit. Only after a stable state has been reached is the successive resetting of the data contents of all the circuit components continued, that is to say the selection circuit is stopped and subsequently activated anew. In a realization that is simple in terms of circuitry, it may be provided in this case that the regulating circuit picks off the data signals of the data bus and detects a deviation of a data signal from the zero value for momentary disconnection and then for the purpose of renewed automatic activation of the selection circuit.

In a particularly preferred embodiment, it is provided that at least one of the circuit components constitutes a random access semiconductor memory device which is constructed on a semiconductor substrate and has a multiplicity of memory cells which can be addressed by an addressing circuit for the purpose of writing in and reading out, as often as desired, data contents which are present at a data input and output circuit. The opening stage of the selection circuit which is assigned to the semiconductor memory device acts directly on the addressing circuit for the purpose of addressing at least one memory cell, and the data input and output circuit is controlled for the purpose of outputting a zero value to the addressed memory cell. In this case, at least some of the circuit components can be assigned to a group of memory cells of the semiconductor memory device which are chronologically successively addressed automatically by the selection circuit for the purpose of resetting the data contents of the memory cells to the logic zero value. On account of the existing decoding scheme of a customary random access semiconductor memory device, the successive addressing of the memory cells by the opening stages of the selection circuit according to the invention becomes very simple. In the case of existing random access semiconductor memory devices, the circuit configuration according to the invention renders it unnecessary to construct additional logic components, which may, under certain circumstances have complicated circuitry. One selection circuit shared by all the memory cells and having a corresponding number of opening stages suffices to select or reset the memory cells of the random access semiconductor memory device. Only after a first cell group has been addressed, that is to say the corresponding word lines of the memory cells are in the active state, is the next cell group of the random access semiconductor memory device addressed. This also ensures that the capacitive loading on the data bus is limited. If, in contrast, all of the registers and memory cells of a semiconductor memory device were opened simultaneously, the data bus would have to have a substantially higher driver capability in order, in the most unfavorable case, to be able to rapidly toggle all of the memory cells of the semiconductor memory device.

In a particularly preferred application of the inventive circuit configuration, the latter refers to the semiconductor chip which is accommodated within a card body of an electronic smart card and includes, in addition to the random access semiconductor memory, as further functional units, in particular a read-only semiconductor memory and/or an electrically erasable semiconductor memory.

Other features which are considered as characteristic for the invention are set forth in the appended claims.

Although the invention is illustrated and described herein as embodied in a circuit configuration having a number of electronic circuit components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
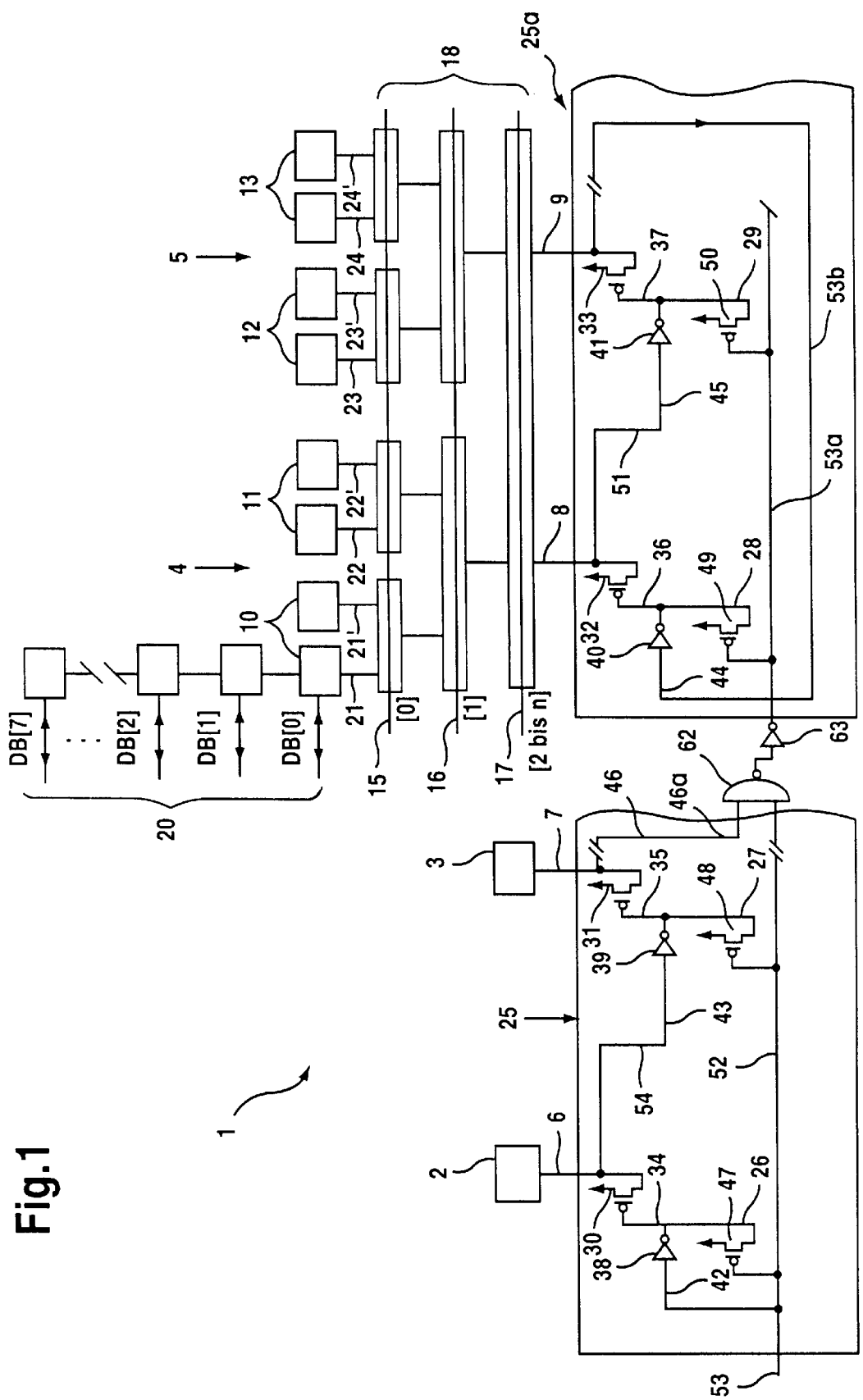
FIG. 1 is a diagrammatic circuit diagram of a circuit configuration having a selection circuit in accordance with an exemplary embodiment of the invention.
Figure 2:
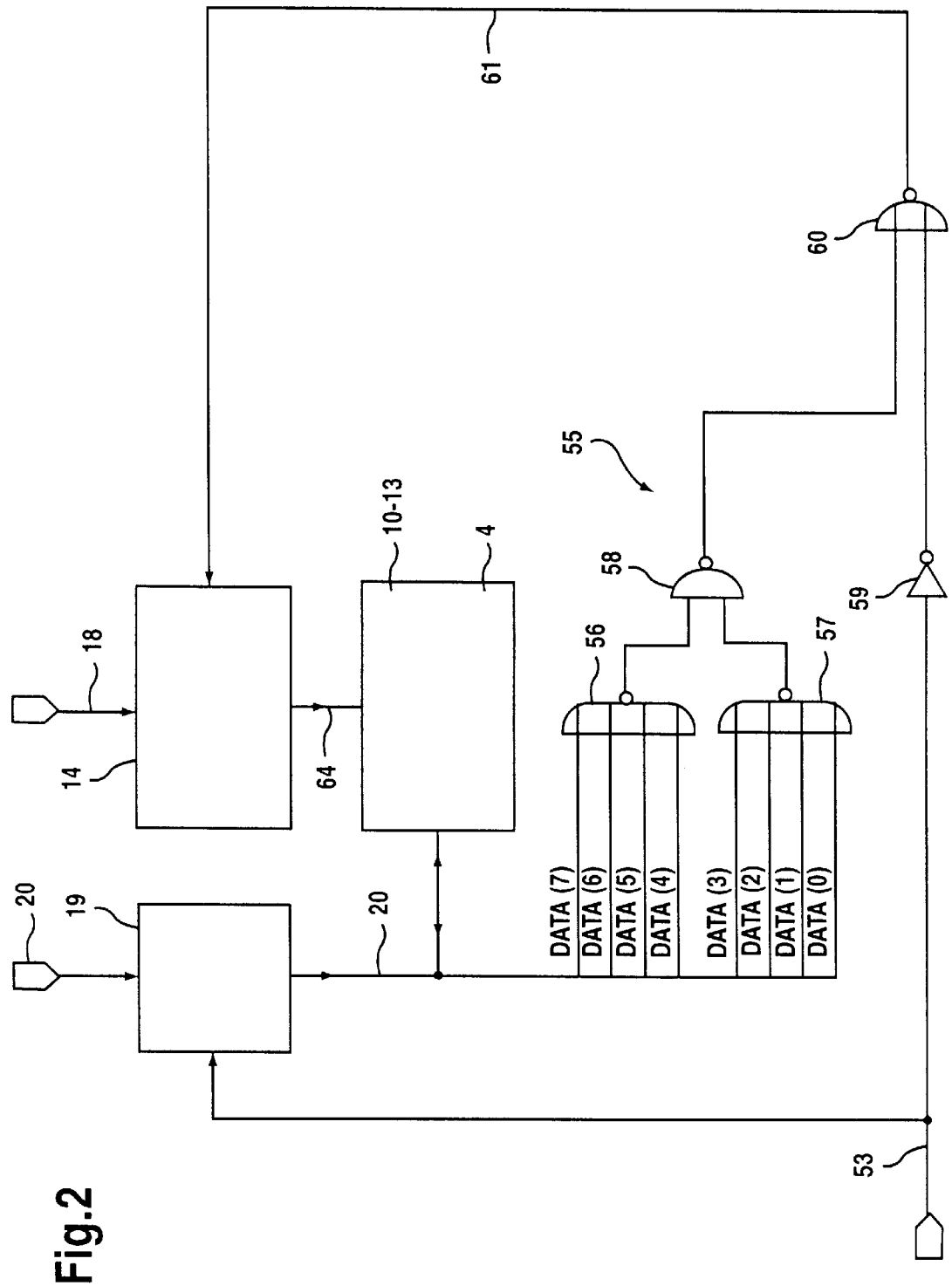
FIG. 2 is a diagrammatic circuit diagram of a regulating circuit assigned to the selection circuit.

Referring now to the figures of the drawing in detail and first, particularly, to FIGS. 1 and 2 thereof, there is shown a circuit configuration 1 according to the invention which has a number of electronic circuit components 2, 3, 4 and 5. The operating state of the circuit components 2–5 can be driven into a reset or erase state by predetermined control signals 6, 7, 8 and 9. The predetermined control signals 6–9 can be applied to the respective circuit component 2 to 5, in which state the data content of the respective circuit component 2 to 5 assumes a logic zero value. The circuit component 4 includes a random access semiconductor memory device (static RAM) which is constructed on a semiconductor substrate and has a first group of memory cells 10 and 11.

The circuit component 5 includes a random access semiconductor memory device (static RAM) which is constructed on the same semiconductor substrate and has a second group of memory cells 12 and 13. The memory cells 10 to 13 can be addressed by an addressing circuit 14 (FIG. 2) in the form of an address decoder, which is known per se and can be activated by address lines 15 (address bit zero), 16 (address bit one) and further address lines 17 (address bit two to n) of an address bus 18. For the purpose of writing in and reading out, as often as desired, 8-bit data of a data input and output circuit 19 (FIG. 2) which is present in a data bus 20 having 8 data lines DB [0] to DB [7], in the way in which this is familiar per se to the person skilled in the art and does not, therefore, need to be explained in any more detail at this point. The circuit component 2 constitutes, for example, a register for the occasional storage of data, and the circuit component 3 constitutes, for example, an accumulator which likewise serves for the occasional storage of data. The register 2 and the accumulator 3 are assigned to a microprocessor (control circuit) which is likewise of integrated construction on the semiconductor substrate, which microprocessor is not illustrated in any more detail in FIGS. 1 and 2 for the sake of clarity. The address decoding of the memory cells 10 to 13 is effected by 8 word select lines 21, 21', 22, 22', 23, 23', 24, 24', which are each electrically coupled to the address decoder 14 (FIG. 2). In addition to the circuit components 2 to 5 illustrated in FIG. 1, it is possible per se to provide as many further circuit components as desired. The further circuit components can likewise be driven into a reset or erase state by the control signals 6–9, in which state the data content assumes a logic zero value.

According to the invention, for the purpose of activating the resetting of the data contents of all the circuit components to the logic zero value, a selection circuit 25, 25a is provided which can be activated automatically. The selection circuit 25, 25a has a number of opening stages 26–29 corresponding to the number of circuit components to be selected. The opening stages 26–29 are connected in series one after the other. Each circuit component 2 to 5 is respectively assigned an opening stage 26–29 of the selection circuit 25 or 25a. Each opening stage 25–29 includes a gate circuit consisting of a switching transistor 30, 31, 32, 33, and a respective driver 38, 39, 40, 41, which drives the control terminal 34, 35, 36, 37 of the switching transistors 30 to 33 and at whose input a respective driver signal 42, 43, 44, 45 is present. At a level value of the driver signal of logic "one", the correspondingly driven switching transistor 30 to 33 is switched on, whereas at a level of logic "zero", the corresponding switching transistor switches off. Each opening stage 26 to 29 furthermore includes an enable switch 47, 48, 49, 50, which is switched on by an enable signal 53 present on an enable signal line 52 provided that the enable signal has the level logic "one", and otherwise switches off at a level of logic "zero" of the enable signal 53. In order to activate the selection circuit 25 or 25a in the sense of chronologically successive selection for the purpose of resetting the data contents of all the circuit components 2 to 5 to the logic zero value, the enable signal is set to the level logic "one". The selection circuit 25 is deactivated in the case of state of the enable signal 53 at the level of logic "zero".

The selection circuit having the two circuit components 25 and 25a according to the exemplary embodiment operates as follows. In order to activate the selection circuit 25, the enable signal 53 is triggered, that is to say the level of the enable signal 53 is set from logic "zero" to the level logic "one", and the switching transistor 30 of the first opening stage 26 switches on for the purpose of selecting the circuit component 2. By the opening signal 6 output by the switching transistor 30, the register 2 is addressed and resetting or erasure of the data content to the logic value zero is controlled. This is followed by the outputting of a driver signal 43 on the line 54, by which signal the second opening stage 27 of the selection circuit 25 is activated and the data content of the circuit component 3 addressed by the second opening stage 27 is erased. The second opening stage 27 then outputs a driver signal 46a on the line 46 via a NAND gate 62 and an inverter 63 which now opens the opening stages 28 and 29 of the second selection circuit 25a for the memory groups 4 and 5. By the way of selecting the memory elements 10 to 13 via the address decoder one memory cell 10 to 13 is always active.

For clarification of the operability of the circuit components 25a it may be assumed in the following that first the memory group 4 is addressed by the address decoder 14. The data content of the memory cells 10 and 11 is thus overwritten automatically with the zero values present on the data bus 20, which corresponds to erasing the memory content of the memory cells. Afterwards, a further driver signal 45 is applied via the line 51 to the driver 41 of the downstream, fourth opening stage 29, which signal switches on the switching transistor 33 of the fourth opening stage 29 for the purpose of outputting a control signal 9. The control signal 9 in turn serves for the selection of the memory cells 12 and 13 of the fourth circuit component 9 by the address decoder 14, whereupon the data contents of the memory cells 12 and 13 are overwritten with the zero value present on the data bus 20. In this way, all of the RAM memory cells 10, 11, 12, 13 of the circuit components 4 and 5 are automatically addressed successively in groups and overwritten with the value logic "zero" on the data bus 20. As a result of the hierarchically structured decoding scheme of the RAM memory, the chronologically successive addressing of the memory cells 10 to 13 can be effected in a simple manner by the selection circuit 25 according to the invention, with the result that only a few additional logic circuits, which are simple to realize in terms of circuitry, have to be provided. Only after the group of memory cells 10 and 11 has been addressed, that is to say the corresponding word lines are in the active state, is the next group of memory cells 12 and 13 of the RAM memory addressed. This ensures that the capacitive loading on the data bus 20 is limited. If, in contrast, all the memory cells 10 to 13 of the RAM memory were opened simultaneously, the date bus 20 would have to have a substantially greater driver capability in order, in the most unfavorable case, to be able rapidly to toggle all the memory cells of the RAM memory to the logic value "zero". The data bus 20 is brought to a defined value immediately after the triggering erase operation, for example all the data lines of the data bus are set to the level logic "zero".

The driver signal output at the end of the selection circuit 25 by the last opening stage 29 is fed back again to the input of the opening stage 28.

FIG. 2 gives a more detailed illustration of a regulating circuit 55 that is assigned to the selection circuit 25a and, in the event of a malfunction, controls renewed activation of the selection circuit 25. In the event that, for instance in the case of an execution time set such that it is too short, the driver power of the data bus 20 should not suffice for driving a register or a RAM memory cell to the logic value "zero", with the result that the circuit which drives the data bus does not have the required driver power. That is to say, despite continued execution of the selection of the circuit components, due to the driver circuit 19, "indirect" values, differing from zero, on the data bus are written to the memory cells. In this case, the regulating circuit 55 ensures that the enable signal 53 for triggering the selection circuit 25 is once again momentarily set to the level logic "zero" and then to logic "one", and a defined new beginning of the domino chain is started. The regulating circuit 55 provided for this purpose includes NOR gates 56, 57, to whose inputs the lines of the data bus 20 are connected, a NAND gate 58, whose inputs are coupled to the outputs of the NOR gates 56 and 57, an inverter 59, at whose input the enable signal 53 is present and a NOR gate 60, whose inputs are coupled to the output of the inverter 59 and the output of the NAND gate 58 and whose output is coupled via a line 61 to the address decoder 14. The reference numeral 64 in turn designates lines on which the opening signals for the registers 2 and 3 are present, or the word select lines for the RAM memory cells 10 to 13. After the activation of the selection circuit 25, that is to say the enable signal 53 is at logic "one", all of the lines of the data bus 20 are driven to logic "zero". If, on account of a specific circumstance, the necessary driver power of the data bus 20 should not suffice for successively toggling the memory cells 10 to 13 of the RAM memory, progress of the opening or resetting of the memory cells when the driver power of the data bus is too low is stopped by the regulating circuit 55, and the successive addressing is continued only when the level of the data bus 20 again assumes stable values of logic "zero". In this way, the logic value "one" is output at the output of the NAND gate 58 if one line of the data bus 20 assumes the value logic "one". As a result, a signal having the value logic "zero" is generated at the output of the NOR gate 60 and the selection circuit 25 is momentarily switched off via the line 61 until the data bus 20 is again at the value logic "zero". Consequently, the selection circuit 25 is automatically reactivated after a specific, predetermined time duration, the enable signal 53 present at the input of the inverter 59 and at the input of the data input and output circuit 19 still being at the value logic "one".

We claim:

1. A circuit configuration, comprising:

a plurality of circuit components including registers, circuit elements and memory elements all having data contents;

a first selection circuit having a number of opening stages including a first opening stage receiving a trigger signal and a last opening stage, said first selection circuit connected to said registers and said circuit elements;

a second selection circuit having a number of opening stages including an initial opening stage connected to said last opening stage of said first selection circuit, said second selection circuit connected to said memory elements;

said first selection circuit and said second selection circuit operating automatically after receiving the trigger signal and operating independently of an external clock supply for chronologically and successively selecting all of said plurality of circuit components for setting the data contents of the circuit components to a logic zero value, said opening stages of said first and second selection circuits connected in series one after another and corresponding to a number of said plurality of circuit components, after receiving said trigger signal said first opening stage outputting a predetermined output signal received by a respective one of said plurality of circuit components, said first opening stage also outputting an opening signal for driving an immediately succeeding opening stage, each of said output stages following said first output stage successively receiving a respective opening signal from a previous output stage and generating a respective output signal received by a respective one of said plurality of circuit components and outputting a respective opening signal to be received by a respective succeeding opening stage; and a data bus having a logic value including a logic zero value connected to said memory elements, said data bus receiving a write signal for writing said logic zero value present on said date bus into said memory elements to bring said memory elements into an erased state after said second selection circuit is actuated.

2. The circuit configuration according to claim 1, wherein each of said plurality of circuit components is connected to a respective opening stage of said first selection circuit and said second selection circuit.

3. The circuit configuration according to claim 1, including an address bus for addressing said plurality of circuit components.

* * * * *